United States Patent
Han

(10) Patent No.: US 8,441,096 B2
(45) Date of Patent: May 14, 2013

(54) FUSE OF SEMICONDUCTOR DEVICE AND METHOD FOR FORMING THE SAME

(75) Inventor: Dong Hee Han, Chungju (KR)

(73) Assignee: Hynix Semiconductor Inc., Icheon (KR)

( * ) Notice: Subject to any disclaimer, the term of this patent is extended or adjusted under 35 U.S.C. 154(b) by 241 days.

(21) Appl. No.: 12/834,001

(22) Filed: Jul. 11, 2010

(65) Prior Publication Data

US 2011/0057290 A1 Mar. 10, 2011

(30) Foreign Application Priority Data

Sep. 10, 2009 (KR) .................. 10-2009-0085375

(51) Int. Cl.
*H01L 23/525* (2006.01)
*H01L 21/768* (2006.01)

(52) U.S. Cl.
USPC ........................................................ 257/529

(58) Field of Classification Search .......... 257/209, 257/528–529, 665, 499; 438/132, 215, 281, 438/333, 467, 601
See application file for complete search history.

(56) References Cited

U.S. PATENT DOCUMENTS

| 6,518,643 | B2 * | 2/2003 | McDevitt et al. | 257/529 |
| 6,933,591 | B1 * | 8/2005 | Sidhu et al. | 257/665 |
| 7,402,887 | B2 * | 7/2008 | Hisaka | 257/529 |
| 8,115,274 | B2 * | 2/2012 | Boeck et al. | 257/529 |
| 2004/0245600 | A1 * | 12/2004 | Kamiya | 257/529 |
| 2005/0161766 | A1 * | 7/2005 | Sato et al. | 257/529 |
| 2007/0013025 | A1 * | 1/2007 | Mun | 257/529 |
| 2008/0067627 | A1 * | 3/2008 | Boeck et al. | 257/529 |
| 2009/0236688 | A1 * | 9/2009 | Cho et al. | 257/529 |

FOREIGN PATENT DOCUMENTS

| KR | 1020060134240 A | 12/2006 |
| KR | 1020080035209 A | 4/2008 |

* cited by examiner

*Primary Examiner* — Dao H Nguyen
*Assistant Examiner* — Tram H Nguyen

(57) ABSTRACT

A fuse of a semiconductor device comprises: a fuse pattern formed on a semiconductor substrate; an insulating film covering one side of the fuse pattern and including a trench; a conductive line disposed on the insulating film including the trench. The fuse of the semiconductor device prevents generation of cracks in a fuse box by thermal and physical stress, thereby improving reliability of the semiconductor device.

7 Claims, 4 Drawing Sheets

FUSE OF SEMICONDUCTOR DEVICE AND METHOD FOR FORMING THE SAME

CROSS-REFERENCE TO RELATED APPLICATION

The priority of Korean patent application No. 10-2009-0085375 filed on Sep. 10, 2009, the disclosure of which is hereby incorporated in its entirety by reference, is claimed.

BACKGROUND OF THE INVENTION

The present invention relates to a fuse of a semiconductor device, and more specifically, to a fuse of a semiconductor device and a method for forming using the same that may alleviate stress A semiconductor device such as a memory device and a memory merged logic (MML) includes a plurality of memory cells for storing data. If even one memory cell of a memory array of a semiconductor device has a defect, the whole device is not capable of serving as a memory since the whole device is defective. However, discarding a memory device for the reason that it contains a defective memory cell, a manufacturing yield would be significantly decreased.

In order to improve a manufacturing yield of a memory device, a repair method is required. The repair method in the semiconductor device is performed by replacing a defective memory cell with a redundancy memory cell. In order to replace a defective memory cell with a redundancy memory cell, a fuse is used. In this respect, a semiconductor device is configured to include a plurality of fuses, and these fuses can be cut by a laser. A test is performed to check whether a defective cell exists in a given semiconductor device, and then the fuses are selectively cut depending on a test result.

In the repair method using a redundancy cell, each cell array includes a redundancy word line and a redundancy bit line. When a defect is found in a specific cell, the defective word line or the defective bit line is substituted with the redundancy word line or the redundancy bit line. In the memory device, when a defective cell is found through a test, a circuit is reconfigured to substitute an address corresponding to the defective cell with an address corresponding to the redundancy cell. As a result, when an address signal corresponding to the defective cell is received, the substituted redundancy cell, instead of the defective cell, is accessed.

Of the above-described repair methods, a widely used method is to blow a fuse with a laser beam, thereby performing cell substitution. For this operation, a general memory device includes a fuse unit configured to substitute a defective address path with a new path by blowing the fuse using a laser.

BRIEF SUMMARY OF THE INVENTION

Various embodiments of the invention are directed to provide a fuse of a semiconductor device that prevents generation of cracks in a fuse box by thermal and physical stress, thereby improving reliability of the semiconductor device.

According to an embodiment of the present invention, a fuse of a semiconductor device comprises: a fuse pattern formed on a semiconductor substrate; an insulating film formed between the semiconductor substrate and the fuse patterns and included a trench between the adjacent fuse patterns; a conductive line formed over the trench and configured to divide the insulating film into a plurality of portions.

The fuse further comprises a contact plug electrically coupling the semiconductor substrate and the fuse pattern.

The fuse further comprises a metal line formed between the semiconductor substrate and the fuse pattern; and a contact plug electrically coupling the metal line and the fuse pattern.

The insulating film comprises a first insulating film electrically insulating the metal line and the fuse pattern; and an interlayer insulting film electrically insulating the fuse pattern and the conductive line.

The insulating film comprises a second insulating film formed over the conductive line in the trench.

The conductive line is formed detached from the fuse pattern and the semiconductor substrate.

The fuse further comprises a metal line formed between the semiconductor substrate and the fuse pattern; and a contact plug electrically coupling the metal line and the fuse pattern; wherein the insulating film electrically insulating the metal line and the fuse pattern; an interlayer insulating film electrically insulating the fuse pattern and the conductive line; and a second insulating film formed over the conductive line in the trench.

According to an embodiment of the present invention, a method for forming a fuse of a semiconductor device comprises: forming a fuse pattern over a semiconductor substrate; forming an insulating film covering one side of the fuse pattern and including a trench; and forming a conductive line on the insulating film including the trench.

Before forming the fuse pattern, the method comprises: forming a metal layer over the semiconductor substrate; patterning the metal layer to form a metal line; forming a first insulating film on the metal line; forming a contact hole in the first insulating film; and forming a contact plug filling the contact hole.

The forming-a-fuse-pattern includes: forming a fuse pattern layer over the first insulating film; and patterning the fuse pattern layer to form the fuse pattern wherein the width of the trench is formed to be smaller than that apart from the fuse pattern.

The forming-an-insulating-film-including-the-trench includes: forming an interlayer insulating film on the first insulating film; and etching the interlayer insulating film and the first insulating film to form the trench.

After forming a conductive line, the method comprises: forming a second insulating film on the insulating film including the conductive line; and forming a polymide isoindro quindzoline (PIQ) layer on the second insulating film.

After forming a PIQ layer, the method comprises: removing the PIQ layer and the second insulating film to expose the fuse pattern and the second insulating film over the conductive line in the trench.

According to an embodiment of the present invention, a method for forming a fuse of a semiconductor device comprises: forming a fuse pattern over a semiconductor substrate; forming an insulating film between the fuse pattern and the semiconductor substrate including a trench being formed between the adjacent fuse patterns; and forming a conductive line in the insulating film, the conductive line being configured to divide the insulating film into a plurality of portion.

The method for forming a fuse of a semiconductor device further comprises: forming a metal line over the semiconductor substrate; and forming a contact plug electrically coupling the metal line and the fuse pattern.

The forming an insulating firm includes: forming a first insulating film electrically insulating the metal line and the fuse pattern; forming an interlayer insulating film electrically insulating the fuse pattern and the conductive line; and forming a second insulating film formed over the conductive line in the trench.

DESCRIPTION OF EMBODIMENTS

The present invention will be described in detail with reference to the attached drawings.

Figure 1:
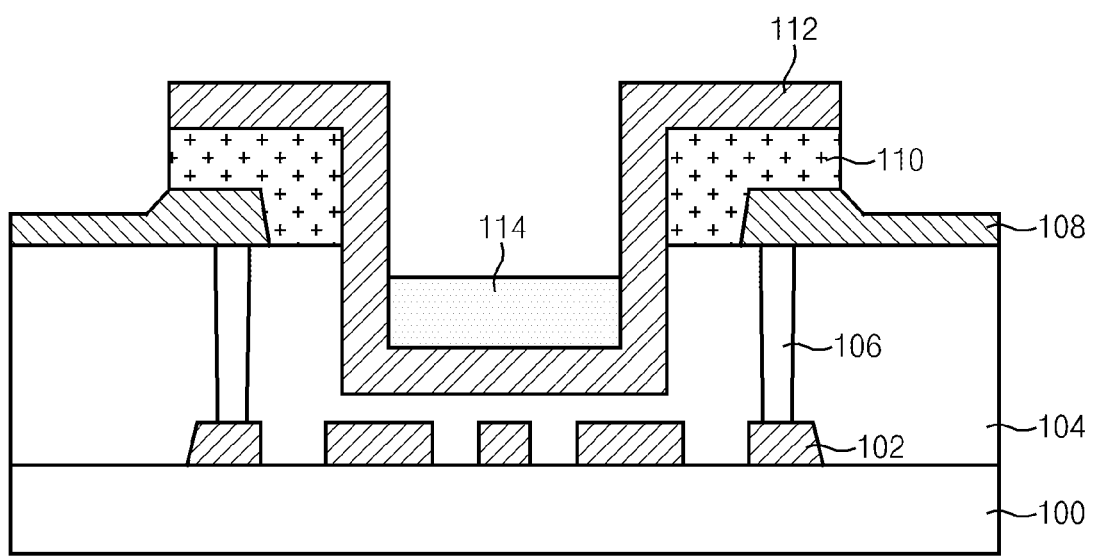
FIG. 1 is a cross-sectional diagram illustrating a fuse of a semiconductor device according to an embodiment of the present invention.

FIG. 1 is a cross-sectional diagram illustrating a fuse of a semiconductor device according to an embodiment of the present invention.

As shown in FIG. 1, a fuse of a semiconductor device comprises a fuse pattern 108 formed over a semiconductor substrate 100, an insulating film (104, 110, 114) formed between the semiconductor substrate 100 and the fuse pattern 108 and between neighboring fuse patterns 108, and a conductive line 112 formed in the insulating film. The conductive line 112 is configured to divide the insulating film into a plurality of small portions to disperse a stress and applied onto the insulating film (104, 110, 114). A metal line 102 is formed over the semiconductor substrate 100 and a contact plug 106 electrically coupling the semiconductor substrate 100 and the fuse patterns 108 is formed. The insulating film (104, 110, 114) includes a trench formed between the neighboring fuse patterns 108, and the conductive line 112 is formed over the trench. The insulating film (104, 110, 114) includes a first insulating film 104 electrically insulating the metal line 102 and the fuse patterns 108, an interlayer insulating film 110 electrically insulating the fuse patterns 108 and the conductive line 112, and a second insulating film 114 formed over the conductive line 112 in a trench.

Although the first insulating film 104 and the interlayer insulating film 110 are separately described in the embodiment of the present invention, the first insulating film 104 and the interlayer insulating film 110 may be integrated to form one body.

A deposition structure including an interlayer insulating film and a polyimide isoindro quinazoline (PIQ) layer disposed on a fuse box prevents a stress from increasing, thereby effectively preventing generation of cracks in the fuse box.

FIGS. 2a to 2d are cross-sectional diagrams illustrating a method for forming a fuse of a semiconductor device according to an embodiment of the present invention.

Figure 2A:
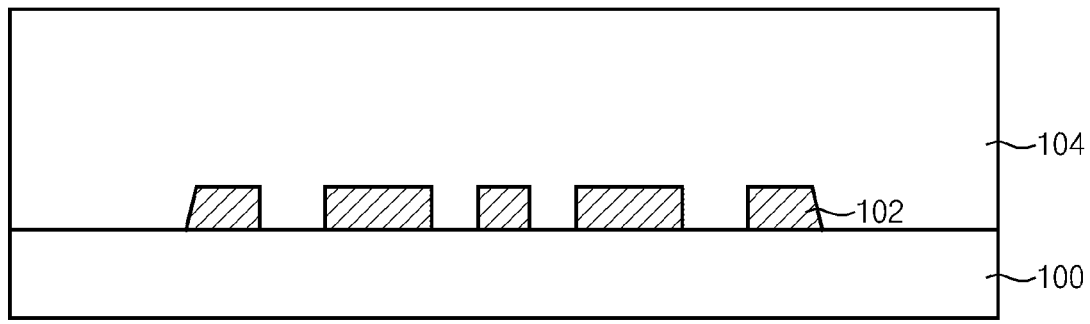
FIGS. 2a to 2d are cross-sectional diagrams illustrating a method for forming a fuse of a semiconductor device according to an embodiment of the present invention.

Referring to FIG. 2a, a metal layer is formed on a semiconductor substrate 100, and patterned to form a metal line 102. A first insulating film 104 is formed on the resultant structure.

Figure 2B:
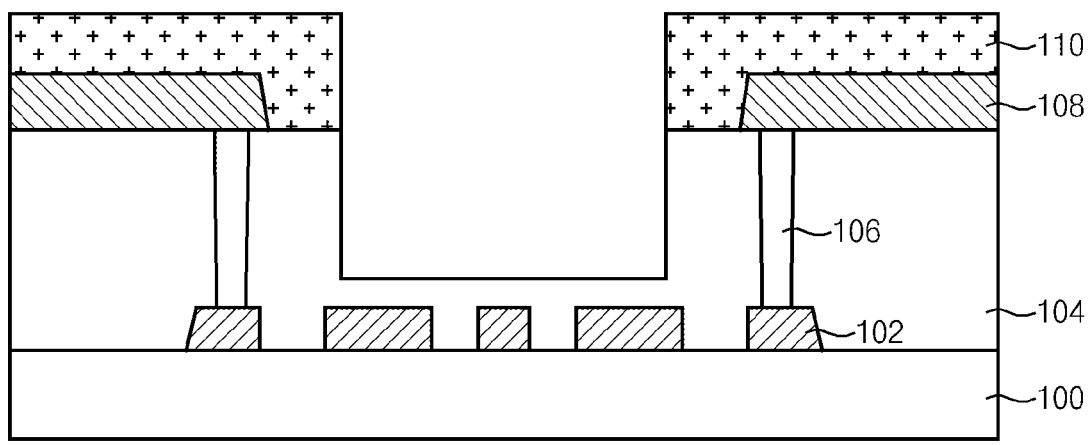

Referring to FIG. 2b, a photoresist pattern (not shown) that defines a contact hole is formed on the first insulating film 104. The first insulating film 104 is etched with the photoresist pattern as an etching mask to form a contact hole. A conductive material is formed on the resultant structure so that the conductive material fills in the contact hole. A planarizing etching process is performed to expose the first insulating film 104, thereby obtaining a contact plug 106. A fuse pattern layer is formed on the resultant structure and patterned to form a fuse pattern 108. The fuse pattern 108 defines a fuse that can be cut by irradiation of a laser. An interlayer insulating film 110 is formed on the resultant structure.

A photoresist pattern (not shown) is formed defining a trench with a certain depth between two neighboring fuse patterns 108 in the interlayer insulating film 110. The interlayer insulating film 110 and the first insulating film 104 are etched with the photoresist pattern (not shown) as an etching mask to form the trench. The trench is formed detached from the metal line 102 so that a conductive line 112 which will be subsequently formed is not electrically coupled to the metal line 102. The trench is also formed detached from the fuse pattern 108 so that the conductive line 112 is not electrically coupled to the fuse patterns 108.

Figure 2C:
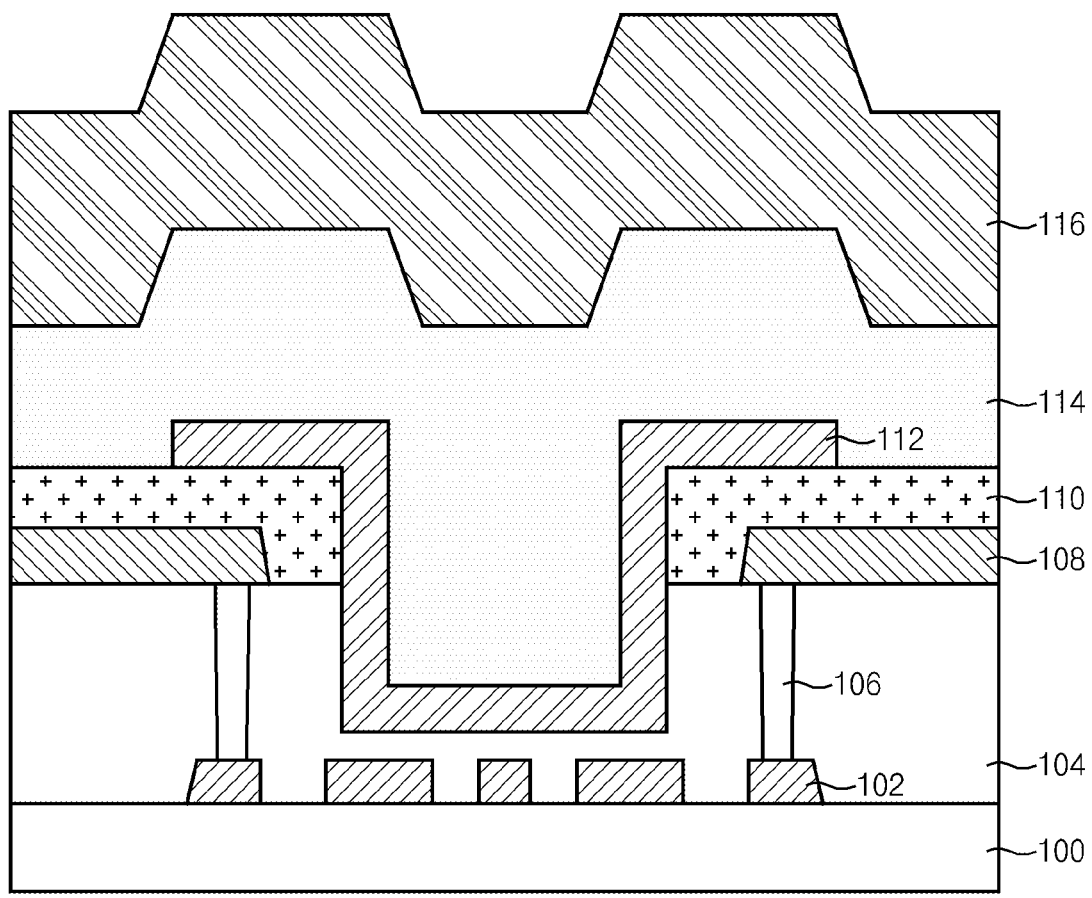

Referring to FIG. 2c, A conductive line layer is formed on the insulating film including the trench, a photoresist pattern that exposes a blowing region of the fuse pattern 108 is formed on the conductive line layer. The conductive line layer is patterned with the photoresist pattern as an etching mask to form the conductive line 112. The conductive line 112 is disposed on the surface of the trench and may extend over the interlayer insulating film 110. Since the conductive line 112 divides a relatively big chunk of the interlayer insulating film 110 and the first insulating film 104 into a plurality of smaller portions in a vertical direction and in a horizontal direction, the conductive line 112 can serve as a stress barrier by preventing a crack due to the stress. Then, a second insulating film 114 and a polyimide isoindro quinazoline (PIQ) layer 116 are formed on the conductive line 112.

Figure 2D:
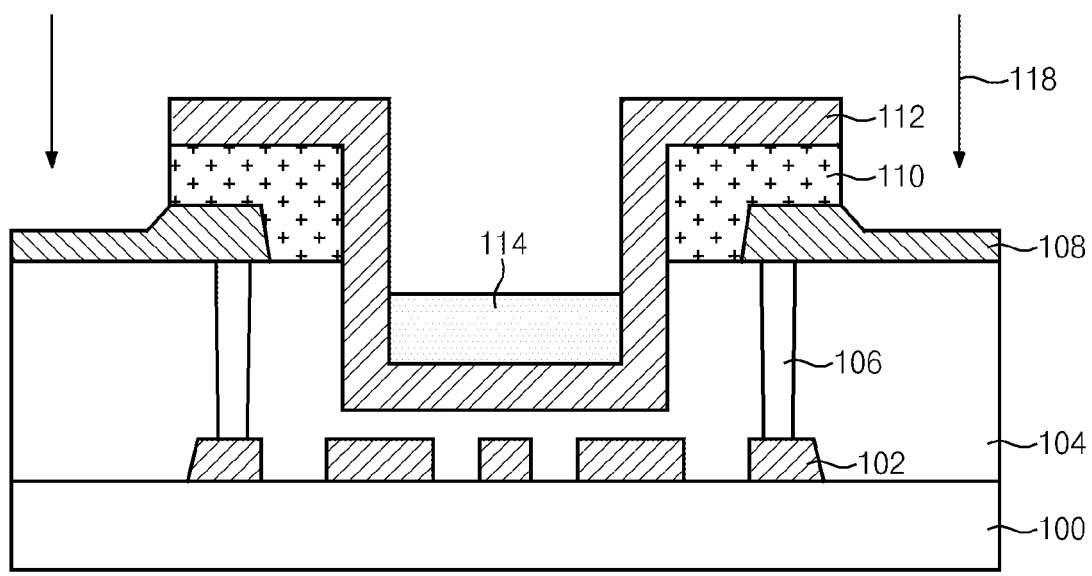

Referring to FIG. 2d, the PIQ layer 116 and the second insulating film 114 are etched to expose the conductive line 112 and to expose the blowing region of the fuse pattern 108. The interlayer insulating film 110 is etched with the conductive line 112 as an etching mask, thereby exposing the blowing region of the fuse pattern 118. In the trench, the second insulating film 114 is not completely etched away but partially remains on the conductive line 112. As a result, a large chunk of the insulating films, i.e., the first insulating film 104, the interlayer insulating film 110 and the second insulating film 114, between neighboring fuse patterns 108 are divided by the conductive line 112 into a plurality of small portions each of which has a relatively small thickness and a relatively small width. Although it is not shown, in order to cut a defective cell and substitute the defective cell with a redundancy cell, a laser is applied into the blowing region of the fuse pattern 108.

By the above-described method, the conductive line is configured as such to serve as a stress barrier. As a result, the method can prevent cracks in the fuse box.

In conclusion, a fuse of a semiconductor device and a method for forming the same according to an embodiment of the present invention prevents cracks of a fuse box, thereby improving yield of the semiconductor device.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A fuse of a semiconductor device comprising:
    a fuse pattern formed over a semiconductor substrate;
    an insulating film formed between the semiconductor substrate and the fuse pattern, the insulating film including a trench separated from the fuse pattern and adjacent fuse patterns; and
    a conductive line formed over the trench and configured to divide the insulating film into a plurality of portions.

2. The fuse of the semiconductor device according to claim 1, further comprising a contact plug electrically coupling the semiconductor substrate and the fuse pattern.

3. The fuse of the semiconductor device according to claim 1, further comprising:
   a metal line formed between the semiconductor substrate and the fuse pattern; and
   a contact plug electrically coupling the metal line and the fuse pattern.

4. The fuse of the semiconductor device according to claim 3, wherein the insulating film comprising:
   a first insulating film electrically insulating the metal line and the fuse pattern; and an interlayer insulating film electrically insulating the fuse pattern and the conductive line.

5. The fuse of the semiconductor device according to claim 3, wherein the insulating film comprising:
   a second insulating film formed over the conductive line in the trench.

6. The fuse of the semiconductor device according to claim 1, wherein the conductive line is formed detached from the fuse pattern and the semiconductor substrate.

7. The fuse of the semiconductor device according to claim 1, further comprising:
   a metal line formed between the semiconductor substrate and the fuse pattern; and
   a contact plug electrically coupling the metal line and the fuse pattern;
   wherein the insulating film comprises:
   a first insulating film electrically insulating the metal line and the fuse pattern;
   an interlayer insulating film electrically insulating the fuse pattern and the conductive line; and
   a second insulating film formed over the conductive line in the trench.

* * * * *